United States Patent
Omote et al.

(10) Patent No.: US 11,469,366 B2
(45) Date of Patent: Oct. 11, 2022

(54) PIEZOELECTRIC FILM AND METHOD FOR PRODUCING SAME

(71) Applicant: IDEAL STAR INC., Sendai (JP)

(72) Inventors: Kenji Omote, Sendai (JP); Tsurugi Samezawa, Sendai (JP); Hiroji Ohigashi, Sendai (JP)

(*) Notice: Subject to any disclaimer, the term of this patent is extended or adjusted under 35 U.S.C. 154(b) by 580 days.

(21) Appl. No.: 16/481,093

(22) PCT Filed: Jan. 10, 2018

(86) PCT No.: PCT/JP2018/000244
§ 371 (c)(1),
(2) Date: Jul. 26, 2019

(87) PCT Pub. No.: WO2018/139190
PCT Pub. Date: Aug. 2, 2018

(65) Prior Publication Data
US 2021/0135089 A1    May 6, 2021

(30) Foreign Application Priority Data
Jan. 26, 2017   (JP) .............................. JP2017-012557

(51) Int. Cl.
*H01L 41/193* (2006.01)
*C08F 214/22* (2006.01)
(Continued)

(52) U.S. Cl.
CPC .......... *H01L 41/193* (2013.01); *C08F 214/22* (2013.01); *H01L 41/081* (2013.01); *H01L 41/257* (2013.01); *H01L 41/45* (2013.01)

(58) Field of Classification Search
CPC ................. C08L 2205/02; C08L 27/16; C08L 2205/025; C08L 2203/16; C09J 2427/20;
(Continued)

(56) References Cited

U.S. PATENT DOCUMENTS 4,173,033 A * 10/1979 Sako ...................... C08F 214/18
                                                              361/323
4,268,653 A *  5/1981 Uchidoi ................ H01L 41/193
                                                              264/435
(Continued)

FOREIGN PATENT DOCUMENTS

JP        62-001744 A      1/1987
JP         3-196412 A      8/1991
(Continued)

OTHER PUBLICATIONS

International Search Report; Japan; dated Mar. 23, 2018.

*Primary Examiner* — Lee E Sanderson
(74) *Attorney, Agent, or Firm* — Patshegen IP; Moshe Pinchas

(57) ABSTRACT

An object of the present invention is to improve the piezoelectricity of a PVT having the VDF ratio of 82 to 90% represented by a copolymer, in which copolymerization of vinylidene fluoride VDF and trifluoroethylene TrFe is 85 versus 15 (this is written as PVT85/15, and which is excellent in resistance to deformation, and heat resistance, etc. And therefore, it is also to obtain a piezoelectric film having piezoelectricity exceeding a PVT of less than 82 mol % of VDF represented by a PVT75/25, which conventionally shows the highest piezoelectricity, and a method of producing the same.

A piezoelectric film is made of a mixture of two kinds (for example, a first copolymer is PVT85/15 and a second copolymer is PVT75/25) having different polymerization ratios of vinylidene fluoride VDF and trifluoroethylene TrFE.

9 Claims, 5 Drawing Sheets

(51) Int. Cl.
  *H01L 41/08* (2006.01)
  *H01L 41/257* (2013.01)
  *H01L 41/45* (2013.01)

(58) Field of Classification Search
  CPC ...... C08F 14/22; C08F 214/22; H01L 41/193;
      H01L 41/22; H01L 41/257; H01L 41/45;
      C08J 5/18
  USPC .......................................................... 526/255
  See application file for complete search history.

(56) References Cited

U.S. PATENT DOCUMENTS

| | | | | |
|---|---|---|---|---|
| 4,560,737 A | * | 12/1985 | Yamamoto | H01L 41/257 264/479 |
| 4,578,442 A | * | 3/1986 | Ohigashi | H01L 41/193 264/435 |
| 4,708,989 A | * | 11/1987 | Broussoux | H01G 4/186 525/199 |
| 2018/0371226 A1 | * | 12/2018 | Marrani | H01L 41/193 |

FOREIGN PATENT DOCUMENTS

| | | |
|---|---|---|
| JP | 7-066467 A | 3/1995 |
| JP | 2011-522096 A | 7/2011 |
| JP | 2013-043903 A | 3/2013 |
| WO | 2016/159354 A1 | 10/2016 |

\* cited by examiner

FIG. 1

| Solution Preparation | Coating | Drying | Heat Treatment | Electrodes Formation | Polarization Treatment |
|---|---|---|---|---|---|
| • Piezoelectric materials<br>① PVT85/15<br>② PVT75/25<br>• Blend ratio<br>①:② = 25:75 ~ 90:10<br>• Solvent<br>N,N-dimethyl-formamide (DMF)<br>• Solution concentration<br>15wt%<br>• Stirring temp.: 50°C<br>time: 12h or more | • Base material<br>Glass<br>• Coating amount<br>Film thickness becomes 30μm after drying<br>• Situation<br>atmosphere | • Equipment<br>vacuum oven<br>• Drying temp.: 65°C<br>time: 1h<br>press.: 3hPa | • Equipment<br>convection oven<br>• Thermal hysteresis<br>room temp.<br>→ 100°C, 30min<br>→ 120°C, 30min<br>→ 130°C, 30min<br>→ 142°C, 2h<br>→ slowly cooling<br>→ room temp.<br>• Film fixation method<br>fixed on the glass base material | • Apparatus<br>deposition machine<br>• Electrode material<br>aluminum<br>• Film formation<br>resistance heating type<br>press.: 3×10-3Pa or less | • Direct method<br>in silicone oil<br>amplitude: 140MV/m<br>wave: triangular wave<br>alternating current<br>frequency: 50mHz<br>number of cycle: 6<br>• Temperature<br>room temp. |

FIG. 2

| Solution Preparation | Coating | Drying | Stretching | Heat Treatment | Electrode Formation | Polarization Treatment |
|---|---|---|---|---|---|---|
| • Piezoelectric materials<br>① PVT85/15<br>② PVT75/25<br>• Blend ratio<br>①:② = 25:75 ~ 90:10<br>• Solvent<br>N, N-dimethyl-formamide (DMF)<br>• Solution concentration<br>15wt%<br>• Stirring<br>temp.: 50°C<br>time: 12h or more | • Base material<br>Glass<br>• Coating aount<br>Film thickness becomes 100μm after drying<br>• Situation<br>atmosphere | • Equipment<br>vacuum oven<br>• Drying<br>temp.: 65°C<br>time: 1h<br>press.: 3hpa | • Equipment<br>dedicated jig<br>• Stretching<br>direction: uniaxial<br>scale factor: 5 times<br>• Temperature<br>room temp. | • Equipment<br>convection oven<br>• Thermal hysterisis<br>room temp.<br>↑↓ 100°C, 30min<br>↑↓ 120°C, 30min<br>↑↓ 130°C, 30min<br>↑↓ 142°C, 30min<br>↑↓ slowly cooling<br>↑↓ room temp.<br>• Film fixation method<br>fixed on the glass base material | • Apparatus<br>deposition machine<br>• Electrode material<br>aluminum<br>• Film formation<br>resistface heating type<br>press.: 3×10⁻³Pa or less | • Direct method<br>in silicon oil<br>amplitude: 120MV/m<br>wave: triangular wave<br>alternating current<br>frequency: 50mHz<br>number of cycle: 6<br>• Temperature<br>room temp. |

PIEZOELECTRIC FILM AND METHOD FOR PRODUCING SAME

TECHNICAL FIELD

The present invention uses a copolymer of vinylidene fluoride (VDF) and trifluoroethylene (TrFE) {This copolymer is written as P(VDF/TrFe), or written exclusively as PVT by simplifying below}, and relates to a piezoelectric film comprising a mixture of at least two kinds of copolymers (hereinafter a first copolymer is written as PVT1 and a second copolymer is written as PVT2), and a producing method thereof.

BACKGROUND ART

The copolymer of vinylidene fluoride (VDF) and trifluoroethylene (TrFE) {This copolymer is written as P(VDF/TrFe), or written exclusively as PVT by simplifying below}, which are ferroelectric polymers, have excellent piezoelectricity as represented by large spontaneous polarization (residual polarization), and they are being studied for application to various elements and devices such as piezoelectric sensors, transducers and infrared pyroelectric sensors etc., which make use of flexibility and processability.

However, because the film of this copolymer PVT usually becomes an aggregate of thick lamellar crystals, it becomes cloudy, it tends to be broken by deformation (inferior in deformation resistance), and then it is restricted in applications.

The present inventors have already indicated the following content in the Non-Patent Documents 1 and 2, and Patent Documents 1 and 2. A single crystalline PVT film, which is obtained by crystallizing a film obtained by uniaxially stretching the copolymer PVT with a paraelectric phase existing at a temperature lower than the melting point and freeing the film surface, has piezoelectricity and transparency, which have not been achieved with existing polymeric piezoelectric materials, and is an excellent polymeric piezoelectric material for applications.

Furthermore, in the Patent Documents 3 and 4, it is indicated that piezoelectric properties are improved by mixing functional molecules different in properties from PVT in the above-mentioned single crystalline PVT film, as the piezoelectric film of mixture of the PVT and hydroxyl fullerene, and the piezoelectric film of mixture of the PVT and carbon nanotube respectively. The single crystalline copolymer PVT, in which the polymerization ratio of VDF and TrFE is 75 to 25 mol % (hereinafter referred to as PVT 75/25), described in the Patent Documents 3 and 4 was still insufficient in heat resistance and deformation resistance.

A copolymer PVT of VDF and TrFE, in which the polymerization ratio of VDF is from 82 mol % (PVT 82/18) to 86 mol % (PVT 86/14), a molecular weight is 600,000/mol or more, and the deformation resistance and the heat resistance were found to be better than that of a piezoelectric film composed of copolymer PVT 75/25, is disclosed in the Patent Document 5. According to this document, the Curie point (the temperature for transition from the ferroelectric phase to the paraelectric phase), which is a typical criterion of heat resistance, is 120° C. for the PVT75/25, whereas it is 156° C. for the PVT85/15, and then significant improvement in heat resistance is seen.

However, in the case of PVT having a VDF ratio of 82 to 90% including the representative example PVT 85/15 of the Patent Document 5, a single crystalline film is not obtained (or is extremely difficult to obtain), and only a lamellar crystal film is obtained. The reason why the single crystalline film is not obtained is that there is no temperature region, which becomes the paraelectric phase below the melting point (As written in the Non-Patent Document 3, the temperature, at which the transition from the ferroelectric phase to the paraelectric phase, ie the Curie point is not below the melting point), and then the single crystalline film producing method described in the Non-Patent documents 1 and 2 and the Patent Documents 1 and 2 cannot be applied.

According to the above conventional technique, with respect to the piezoelectric property having (the magnitude of) the residual polarization as a representative criterion, the single crystalline film is generally superior to the lamellar crystal film in the polymer PVT system. This is because single crystalline film is thought to be due to high molecular chain orientation (the arrangement of molecular chains is aligned in one direction). As written in the Non-Patent Documents 1, 2 and 3, and the Patent Documents 1-5, the highest piezoelectricity has been conventionally obtained with a single crystalline film of PVT having less than 82 mol % of VDF typified by the PVT75/25 (a copolymer having a polymerization ratio of 75 mol % of VDF and 25 mol % of TrFE).

In the comparison between the lamella crystal films, the piezoelectricity of the PVT85/15 exceeds the piezoelectricity of the PVT75/25, but the piezoelectricity of the single crystalline film of the PVT75/25 exceeds the piezoelectricity of the PVT85/15. The reason for this is estimated as follows. By using the single crystalline film, the orientation of the molecular chain increases, and then the piezoelectricity of the PVT75/25 exceeds the piezoelectricity of the PNT85/15, which does not become the single crystalline film and the orientation of the molecular chain remains as the lamellar crystal film.

PRIOR ART DOCUMENTS

Non-Patent Documents

NON-PATENT DOCUMENT 1: Hiroji Ohigashi, Kenji Omote, and Teruhisa Gomyo, Appl. Phys. Lett., 66, 3281 (1995)

NON-PATENT DOCUMENT 2: Kenji Omote, Hiroji Ohigashi, and Keiko Koga, J. Appl. Phys., 81, 2760 (1997)

NON-PATENT DOCUMENT 3: Keiko Koga, Nobuko Nakano, Takeshi Hattori, and Hiroji Ohigashi, J. Appl. Phys., 67, 965 (1990)

NON-PATENT DOCUMENT 4: H. Tanaka, A. J. Lovinger. D. D. Davis: Journal of PolymerScience: Part B: PolymerPhysics, Vol. 28, pp. 2183-2198 (1990)

NON-PATENT DOCUMENT 5: H. Tanaka, H. Yukawa, T. Nishi; Mscromplecules, Vol. 21, pp. 2469-2474 (1988)

PATENT DOCUMENTS

PATENT DOCUMENT 1: JP 2681032 B2
PATENT DOCUMENT 2: JP 3742574 B2
PATENT DOCUMENT 3: JP 2011-080058 A
PATENT DOCUMENT 4: JP 2012-082378 A
PATENT DOCUMENT 5: JP 2016-197626 A

DISCLOSURE OF THE INVENTION

Problems to be Solved by the Invention

An object of the present invention is to improve the piezoelectricity of a PVT having the VDF ratio of 82 to 90% represented by a PVT85/15, which is excellent in resistance to deformation, and heat resistance, etc. And then, it is also to obtain a piezoelectric film having piezoelectricity exceeding a PVT of less than 82 mol % of VDF represented by a PVT75/25, which conventionally shows the highest piezoelectricity, and a method of manufacturing the same.

Solutions for Solve the Problems

As a guide for this object, it is to increase the orientation of the molecular chains of the PVT having the VDF ratio of 82 to 90% by some method. The above Patent Documents 3 and 4 discloses that the orientability is improved by mixing hydroxylated fullerene and carbon nanotube in PVT75/25 and then improving the piezoelectricity.

In the present invention, a means for mixing a second PVT, in which the VDF ratio is small and the polymerization ratio is different, is used for the PVT having the VDF ratio of 82 to 90%. Non-Patent Documents 4 and 5, which examined the compatibility of three types of blends selected by mixing two types from three kind of PVT having different VDF composition ratios (VDF 52 mol %, 65% and 73%), have been published. However, these documents are irrelevant to the piezoelectricity, and the invention concerning the PVT containing 82 to 90 mol % of VDF, which is the object of the present invention, has no overlap with the research contents of these documents. Previous examples of the piezoelectric film technology, which mixes a plurality of PVT of different polymerization ratios according to the present invention, cannot be found at this moment.

Piezoelectric film according to claim 1 of the present invention is a piezoelectric film using a copolymer of vinylidene fluoride (VDF) and trifluoroethylene (TrFE) {This copolymer is written as P(VDF/TrFe), or written exclusively as PVT by simplifying}, and comprising a mixture of at least two kinds of copolymers (a first copolymer is written as PVT1 and a second copolymer is written as PVT2), wherein the first copolymer PVT1 is selected from a copolymerization ratio of VDF: 82 to 90% versus TrFE: 18 to 10% in molar ratio, and the second copolymer PVT2 is selected from a copolymerization ratio of VDF: 60 to 82% versus TrFE: 40 to 18% in molar ratio.

Piezoelectric film according to claim 2 of the present invention is the piezoelectric film according to claim 1, wherein the first copolymer PVT1 is a copolymer PVT having a VDF polymerization ratio of 85 mol % and TrFe polymerization ratio of 15 mol % (this copolymer PVT is represented as PVT85/15), and the second copolymer is a copolymer PVT75/25 having a VDF polymerization ratio of 75 mol % and TrFe polymerization ratio of 25 mol %.

Piezoelectric film according to claim 3 of the present invention is the piezoelectric film according to claim 2, wherein a mixing ratio of PVT1 (PVT85/15) is in the range of 50 wt % to 80 wt %.

As shown in FIG. 3, when the mixing ratio of the first copolymer PVT85/15 is 50% or more by weight, the value of residual polarization of the piezoelectric film starts to increase. And, when the ratio by weight is 80% or less by weight, the value of residual polarization of the piezoelectric film is in the region holding an increase.

Piezoelectric film according to claim 4 of the present invention is the piezoelectric film according to claim 1, wherein the first copolymer PVT1 is a copolymer PVT having a VDF polymerization ratio of 85 mol % and TrFe polymerization ratio of 15 mol % (this copolymer PVT is represented as PVT85/15), and the second copolymer is a copolymer PVT81/19 having a VDF polymerization ratio of 81 mol % and TrFe polymerization ratio of 19 mol %.

Piezoelectric film according to claim 5 of the present invention is the piezoelectric film according to claim 4, wherein a mixing ratio of PVT1 (PVT85/15) is in the range of 30 wt % to 70 wt %.

As shown in FIG. 6, when the mixing ratio of the first copolymer PVT85/15 is 30% or more by weight, the value of residual polarization of the piezoelectric film starts to increase. And, when the ratio by weight is 70% or less by weight, the value of residual polarization of the piezoelectric film is in the region holding an increase.

Producing method of piezoelectric film according to claim 6 of the present invention is a producing method of a piezoelectric film using a copolymer of vinylidene fluoride (VDF) and trifluoroethylene (TrFE) {This copolymer is written as P(VDF/TrFe), or written exclusively as PVT by simplifying}, and comprising a mixture of at least two kinds of copolymers (a first copolymer is written as PVT1 and a second copolymer is written as PVT2), wherein the first copolymer PVT1 is selected from a copolymerization ratio of VDF: 82 to 90% versus TrFE: 18 to 10% in molar ratio, the second copolymer PVT2 is selected from a copolymerization ratio of VDF: 60 to 82% versus TrFE: 40 to 18% in molar ratio, a solution of a mixture of the two kinds of copolymers and a solvent is applied to a substrate and dried, and a film of the copolymer mixture formed by drying is heat treated at a temperature range between 140° C. and a melting point. As shown in FIG. 1 and FIG. 5, the piezoelectric film obtained by the present producing method is a lamellar crystal film.

Producing method of piezoelectric film according to claim 7 of the present invention is a producing method of a piezoelectric film using a copolymer of vinylidene fluoride (VDF) and trifluoroethylene (TrFE) {This copolymer is written as P(VDF/TrFe), or written exclusively as PVT by simplifying}, and comprising a mixture of at least two kinds of copolymers (a first copolymer is written as PVT1 and a second copolymer is written as PVT2), wherein the first copolymer PVT1 is selected from a copolymerization ratio of VDF: 82 to 90% versus TrFE: 18 to 10% in molar ratio, the second copolymer PVT2 is selected from a copolymerization ratio of VDF: 60 to 82% versus TrFE: 40 to 18% in molar ratio, a solution of a mixture of the two kinds of copolymers and a solvent is applied to a substrate and dried, a film of the copolymer mixture formed by drying is stretched, and the film is heat treated at a temperature range between 140° C. and a melting point. As shown in FIG. 2, the piezoelectric film obtained by the present producing method seems to a single crystalline film.

Producing method of piezoelectric film according to claim 8 of the present invention is the producing method of the piezoelectric film according to claim 6 or 7, wherein the first copolymer PVT1 is a copolymer PVT having a VDF polymerization ratio of 85 mol % and TrFe polymerization ratio of 15 mol % (this copolymer PVT is represented as PVT85/15) and the second copolymer is a copolymer PVT75/25 having a VDF polymerization ratio of 75 mol % and TrFe polymerization ratio of 25 mol %, and a mixing ratio of PVT1 (PVT85/15) is in the range of 50 wt % to 80 wt %.

Producing method of piezoelectric film according to claim 9 of the present invention is the producing method of the piezoelectric film according to claim 6 or 7, wherein the first copolymer PVT1 is a copolymer PVT having a VDF polymerization ratio of 85 mol % and TrFe polymerization ratio of 15 mol % (this copolymer PVT is represented as PVT85/15) and the second copolymer is a copolymer PVT81/19 having a VDF polymerization ratio of 81 mol % and TrFe polymerization ratio of 19 mol %, and a mixing ratio of PVT1 (PVT85/15) is in the range of 30 wt % to 70 wt %.

Effects of the Invention

According to the piezoelectric film of claim 1 of the present invention, it is possible to provide the piezoelectric film having high residual polarization and high electromechanical coupling coefficient.

According to the piezoelectric film of claim 2 of the present invention, it is possible to provide the piezoelectric film having high residual polarization and high electromechanical coupling coefficient by selecting the PVT2 as PVT75/25.

According to the piezoelectric film of claim 3 of the present invention, it is possible to provide the piezoelectric film having the optimum weight % value of the PVT1 (PVT85/15).

According to the piezoelectric film of claim 4 of the present invention, it is possible to provide the piezoelectric film having high residual polarization and high electromechanical coupling coefficient by selecting the PVT2 as PVT81/19.

According to the piezoelectric film of claim 5 of the present invention, it is possible to provide the piezoelectric film having the optimum weight % value of the PVT1 (PVT85/15).

According to the producing method of the piezoelectric film of claim 6 of the present invention, it is possible to provide the producing method of the piezoelectric film, which is a lamellar crystal film having high residual polarization and high electromechanical coupling coefficient.

According to the producing method of the piezoelectric film of claim 7 of the present invention, it is possible to provide the producing method of the piezoelectric film, which is a single crystalline film having high residual polarization and high electromechanical coupling coefficient.

According to the producing method of the piezoelectric film of claim 8 of the present invention, the PVT2 is selected as PVT75/25, and it is possible to provide the piezoelectric film having the optimum weight % value of the PVT1 (PVT85/15).

According to the producing method of the piezoelectric film of claim 9 of the present invention, the PVT2 is selected as PVT81/19, and it is possible to provide the piezoelectric film having the optimum weight % value of the PVT1 (PVT85/15).

According to the present invention, the piezoelectricity of the PVT having the VDF ratio of 82 to 90% represented by the PVT85/15, which is excellent in resistance to deformation, and heat resistance, etc., is improved, and then the piezoelectric film having piezoelectricity exceeding the PVT of less than 82 mol % of the VDF represented by the PVT75/25, which conventionally shows the highest piezoelectricity, and the method of manufacturing the piezoelectric film can be obtained.

BRIEF DESCRIPTION OF THE DRAWINGS

FIG. 1 shows a process flow diagram of a method for producing a blended lamella crystal piezoelectric film of Example 1-1.

FIG. 2 shows a process flow diagram of a method for producing a blended single crystalline piezoelectric film of Example 1-2.

MODE FOR CARRYING OUT THE INVENTION

A piezoelectric film according to the embodiment of the present invention uses a copolymer of vinylidene fluoride (VDF) and trifluoroethylene (TrFE) {This copolymer is written as P(VDF/TrFe), or written exclusively as PVT by simplifying below.}. This piezoelectric film comprises a mixture of at least two kinds of copolymers (a first copolymer is written as PVT1 and a second copolymer is written as PVT2), the first copolymer PVT1 is selected from a copolymerization ratio of VDF: 82 to 90% versus TrFE: 18 to 10% in molar ratio, and the second copolymer PVT2 is selected from a copolymerization ratio of VDF: 60 to 82% versus TrFE: 40 to 18% in molar ratio.

In the piezoelectric film, the first copolymer PVT1 is a copolymer PVT85/15, which has a VDF polymerization ratio of 85 mol % and a TrFE polymerization ratio of 15 mol %, and the second copolymer PVT2 is a copolymer PVT75/25, which has a VDF polymerization ratio of 75 mol % and a TrFE polymerization ratio of 25 mol %. The piezoelectric film is characterized in that a mixing ratio of PVT1 (PVT85/15) is in the range of 50 wt % to 80 wt %.

Figure 3:
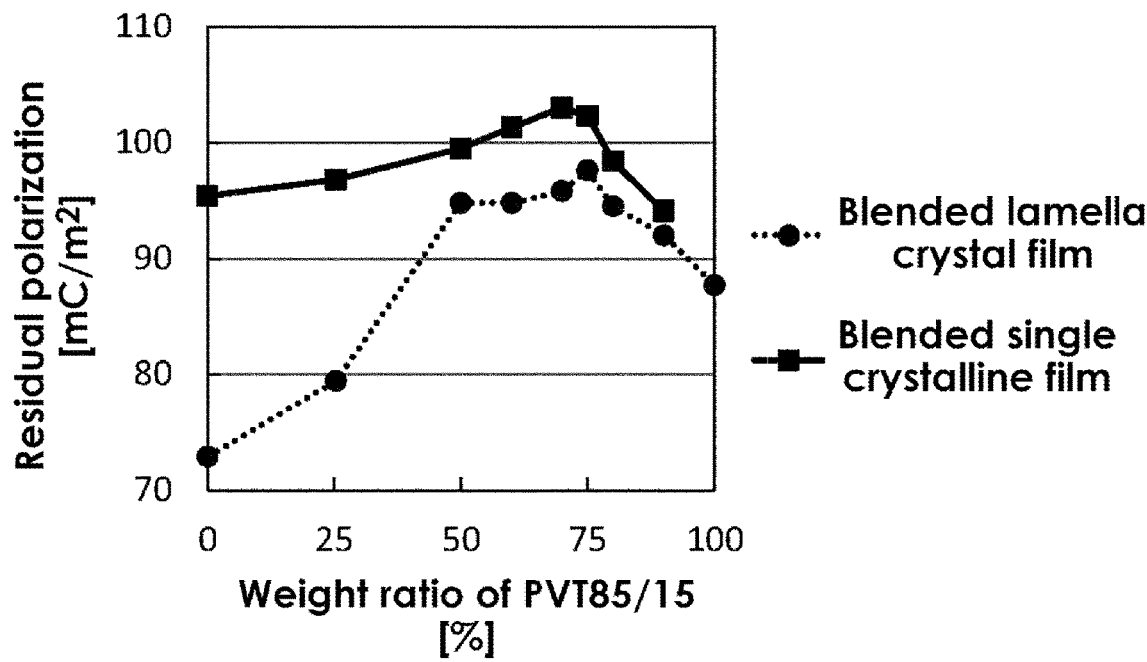
FIG. 3 shows a graph indicating the relationship between weight ratio (%) of PVT85/15 and residual polarization ($mC/m^2$) of a blended piezoelectric film comprising PVT85/15 and PVT75/25.
Figure 4:
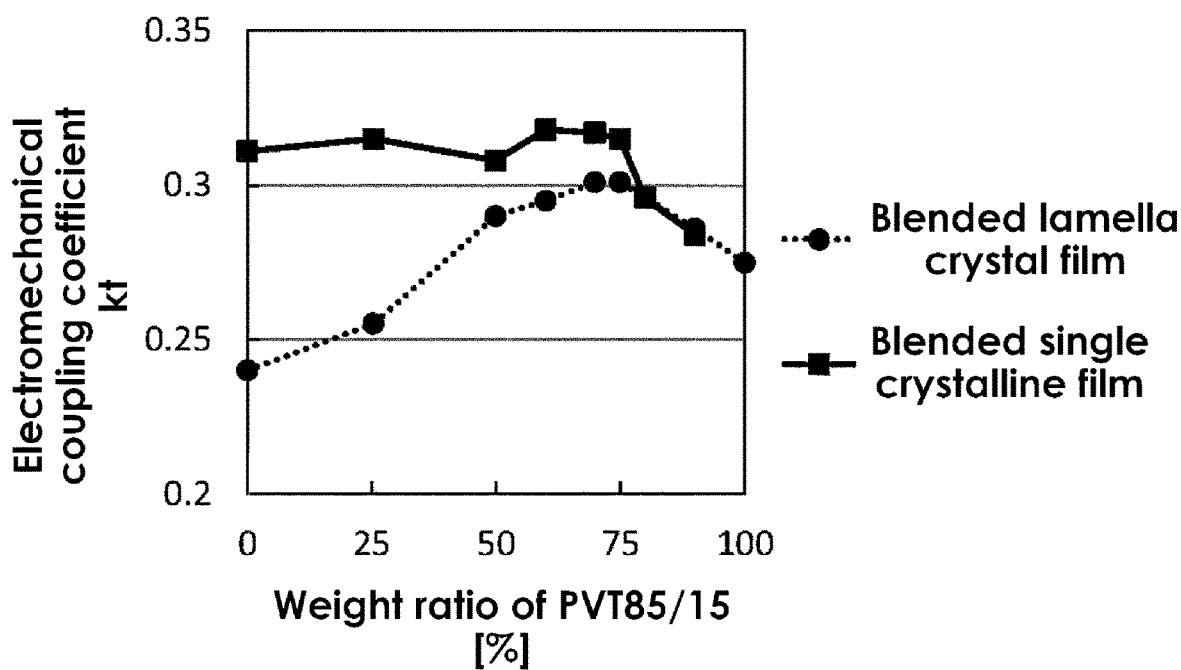
FIG. 4 shows a graph indicating the relationship between weight ratio (%) of PVT85/15 and electromechanical coupling coefficient kt of a blended piezoelectric film comprising PVT85/15 and PVT75/25.

Following content is appear from FIG. 3. When the mixing ratio of the first copolymer PVT 85/15 is 50 weight % or more by weight ratio, it enters a region, where the numerical value of the residual polarization of the piezoelectric film begins to rise, and is 80 weight % or less, the numerical value of the residual polarization of the piezoelectric film is in the region, where the increase is held.

As another example, in the piezoelectric film, the first copolymer PVT1 is a copolymer PVT85/15, which has a VDF polymerization ratio of 85 mol % and a TrFE polymerization ratio of 15 mol %, and the second copolymer PVT2 is a copolymer PVT81/19, which has a VDF polymerization ratio of 81 mol % and a TrFE polymerization ratio of 19 mol %. The piezoelectric film is characterized in that the mixing ratio of PVT1 (PVT85/15) is in the range of 30 wt % to 70 wt %.

Figure 6:
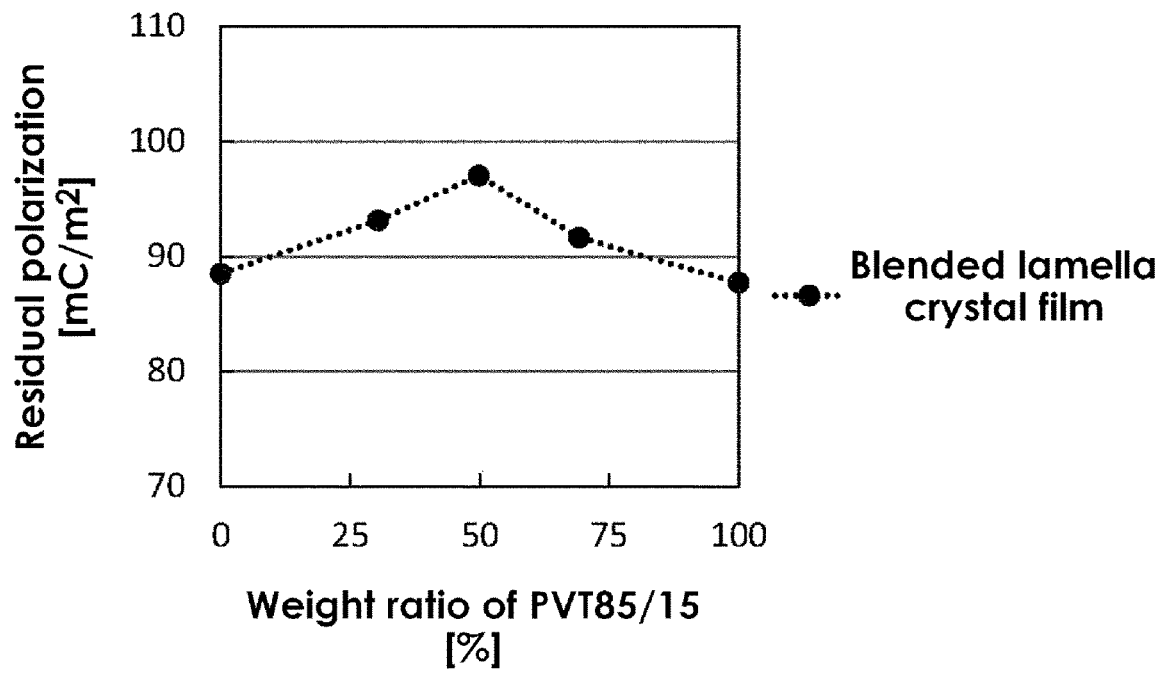
FIG. 6 shows a graph indicating the relationship between weight ratio (%) of PVT85/15 and residual polarization (mC/m2) of a blended piezoelectric film comprising PVT85/15 and PVT81/19.
Figure 7:
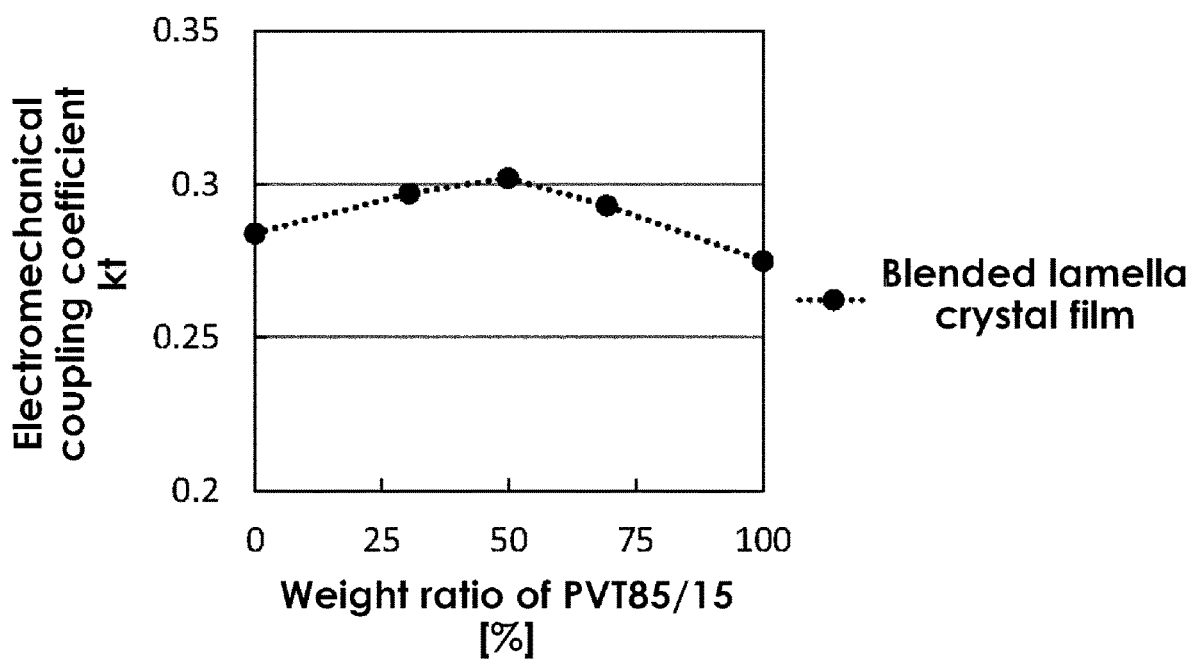
FIG. 7 shows a graph indicating the relationship between weight ratio (%) of PVT85/15 and electromechanical coupling coefficient kt of a blended piezoelectric film comprising PVT85/15 and PVT81/19.

Following content is appear from FIG. 6. When the mixing ratio of the first copolymer PVT 85/15 is 30 weight % or more by weight ratio, it enters a region, where the numerical value of the residual polarization of the piezoelectric film begins to rise, and is 70 weight % or less, The numerical value of the residual polarization of the piezoelectric film is in the region, where the increase is held.

A method of producing a piezoelectric film according to the embodiment of the present invention uses a copolymer of vinylidene fluoride (VDF) and trifluoroethylene (TrFE) {This copolymer is written as P(VDF/TrFe), or written exclusively as PVT by simplifying below.}. This piezoelectric film comprises a mixture of at least two kinds of copolymers (a first copolymer is written as PVT1 and a second copolymer is written as PVT2), the first copolymer PVT1 is selected from a copolymerization ratio of VDF: 82 to 90% versus TrFE: 18 to 10% in molar ratio, and the second copolymer PVT2 is selected from a copolymerization ratio of VDF: 60 to 82% versus TrFE: 40 to 18% in molar ratio. A solution of a mixture of the two kinds of copolymers and a solvent is applied to a substrate and dried, and a film of the copolymer mixture formed by drying is heat treated at a temperature range between 140° C. and a melting point. At this point, a piezoelectric film of a lamella crystal film is produced by the method of producing the piezoelectric film.

And, as other example, a method of producing a piezoelectric film according to the embodiment of the present invention uses a copolymer of vinylidene fluoride (VDF) and trifluoroethylene (TrFE) {This copolymer is written as P(VDF/TrFE), or written exclusively as PVT by simplifying below.}. This piezoelectric film comprises a mixture of at least two kinds of copolymers (a first copolymer is written as PVT1 and a second copolymer is written as PVT2), the first copolymer PVT1 is selected from a copolymerization ratio of VDF: 82 to 90% versus TrFE: 18 to 10% in molar ratio, and the second copolymer PVT2 is selected from a copolymerization ratio of VDF: 60 to 82% versus TrFE: 40 to 18% in molar ratio. A solution of a mixture of the two kinds of copolymers and a solvent is applied to a substrate and dried, a film of the copolymer mixture formed by drying is stretched, and the film is heat treated at a temperature range between 140° C. and a melting point. At this point, a piezoelectric film of a single crystalline film is produced by the method of producing the piezoelectric film.

In the method for producing a piezoelectric film the copolymer PVT1 having a VDF polymerization ratio of 85 mol % and a TrFE copolymerization ratio of 15 mol % (represented by PVT85/15), the second copolymer PVT2 is a copolymer PVT75/25 with VDF 75% and TrFE 25%, and the mixing ratio of PVT 1 (PVT85/15) is in the range of 50 wt % to 80 wt %.

In the method for producing a piezoelectric film the copolymer PVT 1 having a VDF polymerization ratio of 85 mol % and a TrFE copolymerization ratio of 15 mol % (represented by PVT85/15), the second copolymer PVT 2 is a copolymer PVT81/19 with VDF 81% and TrFE 19%, and the mixing ratio of PVT 1 (PVT85/15) is in the range of 30 wt % to 70 wt %.

EXAMPLE

Example 1-1

FIG. 1 shows a process flow diagram of a method for producing a blended lamella crystal piezoelectric film. The production process of the piezoelectric film is carried out in the order of a solution preparation process, a coating process, a drying process, a heat treatment process, electrodes formation process and a polarization treatment process, and the blended lamella crystal piezoelectric film is produced.

Detailed descriptions of individual processes of Example 1-1 are listed below.
Solutions Preparation Process
PVT85/15 is selected as PVT1 and PVT75/25 is selected as PVT2, and 7 kinds of solutions with different mixing weight ratios of PVT1 and PVT2 in the range of 25:75 to 90:10 are dissolved in N, N-dimethylformamide (DMF), respectively.
Coating Process
A glass base material, which becomes a substrate, is prepared, and the solutions are coated onto the glass base material.
Drying Process
The coated film is dried at 65° C. for 1 hour at 3 hPa by using a vacuum oven. The thickness of the film obtained after the drying process is about 30 μm.
Heat Treatment Process
The film coated on the glass base material is heated at 142° C. for 2 hours in a convection oven to crystallize.
Electrodes Formation Process
Aluminum is heated and evaporated at a pressure of 3×10−3 Pa or less using a resistance heating type vacuum deposition machine to form electrode coatings on both sides of the film.
Polarization Treatment Process
In the polarization treatment process, the film is placed in silicone oil, and a triangular wave alternating current with an amplitude of 140 MV/m and a frequency of 50 mHz is applied directly between the electrodes on both sides of the film for six cycles.

Example 1-2

FIG. 2 shows a process flow diagram of a method for producing a blended single crystalline piezoelectric film. The production process of the piezoelectric film is carried out in the order of a solution preparation process, a coating process, a drying process, a stretching process, a heat treatment process, electrodes formation process and a polarization treatment process, and the blended single crystalline piezoelectric film is produced.

Detailed descriptions of individual processes of Example 1-2 are listed below.
Solutions Preparation Process
PVT85/15 is selected as PVT1 and PVT75/25 is selected as PVT2, and 7 kinds of solutions with different mixing weight ratios of PVT1 and PVT2 in the range of 25:75 to 90:10 are dissolved in N, N-dimethylformamide (DMF), respectively.
Coating Process
A glass base material, which becomes a substrate, is prepared, and the solutions are coated onto the glass base material.
Drying Process
The coated film is dried at 65° C. for 1 hour at 3 hPa by using a vacuum oven. The thickness of the film obtained after the drying process is about 100 μm.
Stretching Process
The dried film is removed from the glass base material, and the film is deformed to a length of 5 times in a uniaxial direction using a dedicated jig, and held in that state.

Heat Treatment Process

The film fixed to the dedicated jig is heated at 142° C. for 2 hours in a convection oven to crystallize. The thickness of the film obtained after the heat treatment process is about 30 to 45 μm.

Electrodes Formation Process

Aluminum is heated and evaporated at a pressure of 3×10−3 Pa or less using a resistance heating type vacuum deposition machine to form electrode coatings on both sides of the film.

Polarization Treatment Process

In the polarization treatment process, the film is placed in silicone oil, and a triangular wave alternating current with an amplitude of 120 MV/m and a frequency of 50 mHz is applied directly between the electrodes on both sides of the film for six cycles.

Example 2

Table 1 shows the each measurement result of the residual polarization Pr, the coercive electric field Ec, and the electromechanical coupling coefficient kt of the piezoelectric films of Example 1-1 (Invention 1) and Example 1-2 (Invention 2). And, comparison list with measurement results of residual polarizations, coercive electric fields, and an electromechanical coupling coefficients kt of each piezoelectric film of example (1, 2 and 3) is shown.

The residual polarization Pr and the coercive electric field Ec were read from the D (electrical displacement)-E (electric field) hysteresis curve measured during the polarization process. The D-E hysteresis curve is obtained from the waveform of the charge amplifier output at sixth cycle, where E is applied 140 MV/in for the lamellar crystal film and 120 MV/m for the single crystal film with 50 mHz triangular wave AC for 6 cycles. The electromechanical coupling coefficient kt is obtained by washing a polarized sample with hexane, cutting it to a size of 5 mm×5 mm, sampling Cp (electrostatic capacitance)-G (conductance) data in the range of 1 kHz to 110 MHz by using an impedance analyzer, and being calculated by using a free resonance analysis formula.

[Table 1]

TABLE 1

Piezoelectric properties of blended lamella crystal piezoelectric film and blended single crystalline piezoelectric film

| | Kind of film | PVT1 = PVT85/15 [wt %] | PVT2 = PVT75/25 [wt %] | Residual Polarization Pr [mC/m$^2$] | Coercive electric field Ec [MV/m] | Electromechanical coupling coefficient Kt |
|---|---|---|---|---|---|---|
| Invention 1 | Blended lamella crystal film | 25 | 75 | 79.4 | 43.9 | 0.251 |
| | | 50 | 50 | 94.8 | 42.8 | 0.290 |
| | | 60 | 40 | 94.8 | 44.9 | 0.295 |
| | | 70 | 30 | 95.8 | 45.6 | 0.301 |
| | | 75 | 25 | 97.6 | 45.2 | 0.299 |
| | | 80 | 20 | 94.5 | 45.6 | 0.296 |
| | | 90 | 10 | 92.0 | 44.7 | 0.286 |
| Invention 2 | Blended single crystalline film | 25 | 75 | 96.8 | 45.8 | 0.315 |
| | | 50 | 50 | 99.5 | 47.7 | 0.308 |
| | | 60 | 40 | 101.3 | 42.5 | 0.318 |
| | | 70 | 30 | 103.0 | 42.7 | 0.317 |
| | | 75 | 25 | 102.3 | 42.9 | 0.315 |
| | | 80 | 20 | 98.4 | 44.2 | 0.296 |
| | | 90 | 10 | 94.1 | 38.3 | 0.284 |
| Comparison item 1 | Lamella crystal film | 100 | 0 | 87.7 | 42.9 | 0.275 |
| Comparison item 2 | Lamella crystal film | 0 | 100 | 72.9 | 45.5 | 0.240 |
| Comparison item 3 | Single crystalline film | 0 | 100 | 95.4 | 49.7 | 0.311 |

Note:

Comparison items 1 and 2 are produced with same producing method of the Example 1-1, and Comparison item 3 are produced with same method of the Example 1-2.

Example 3

Figure 5:
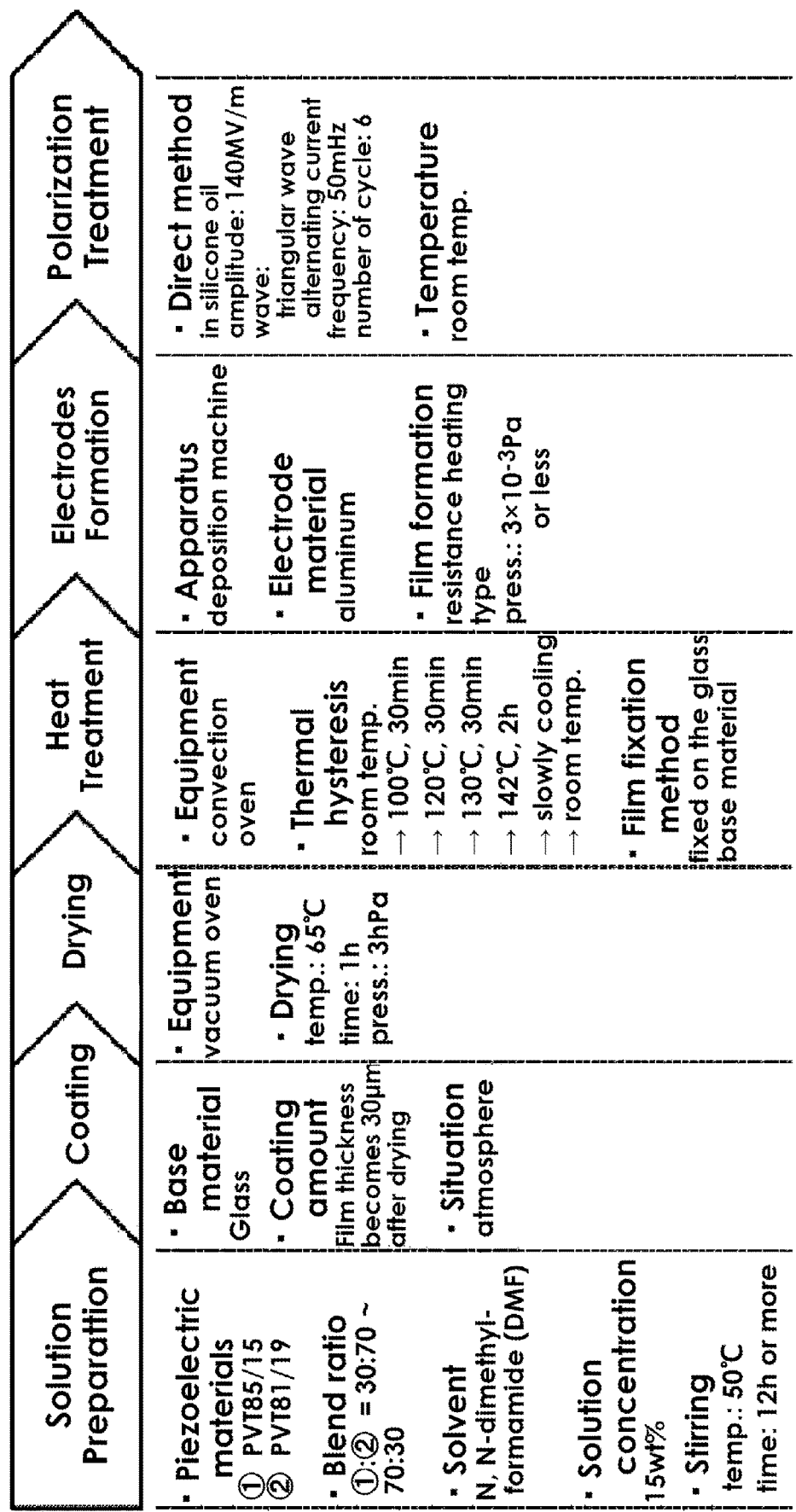
FIG. 5 shows a process flow diagram of a method for producing a blended lamella crystal piezoelectric film of Example 3.

FIG. 5 shows a process flow diagram of a method for producing a blended lamella crystal piezoelectric film. The production process of the piezoelectric film is carried out in the order of a solutions preparation process, a coating process, a drying process, a heat treatment process, electrodes formation process and a polarization treatment process, and the blended lamella crystal piezoelectric film is produced.

Detailed descriptions of individual processes of Example 3 are listed below.

Solutions Preparation Process

PVT85/15 is selected as PVT1 and PVT81/19 is selected as PVT2, and 3 kinds of solutions with different mixing weight ratios of PVT1 and PVT2 in the range of 30:75 to 70:30 are dissolved in N, N-dimethylformamide (DMF), respectively.

Coating Process

A glass base material, which becomes a substrate, is prepared, and the solutions are coated onto the glass base material.

Drying Process

The coated film is dried at 65° C. for 1 hour at 3 hPa by using a vacuum oven. The thickness of the film obtained after the drying process is about 30 μm.

Heat Treatment Process

The film coated on the glass base material is heated at 142° C. for 2 hours in a convection oven to crystallize.

Electrodes Formation Process

Aluminum is heated and evaporated at a pressure of $3 \times 10^{-3}$ Pa or less using a resistance heating type vacuum deposition machine to form electrode coatings on both sides of the film.

Polarization Treatment Process

In the polarization treatment process, the film is placed in silicone oil, and a triangular wave alternating current with an amplitude of 140 MV/m and a frequency of 50 mHz is applied directly between the electrodes on both sides of the film for six cycles.

Example 4

Table 2 shows the each measurement result of the residual polarization Pr, the coercive electric field Ec, and the electromechanical coupling coefficient kt of the piezoelectric films of Example 3 (Invention 3). And, comparison list with measurement results of residual polarizations, coercive electric fields, and an electromechanical coupling coefficients kt of each piezoelectric film of example (1, 4) is shown.

The residual polarization Pr and the coercive electric field Ec were read from the D (electrical displacement)-E (electric field) hysteresis curve measured during the polarization process. The D-E hysteresis curve is obtained from the waveform of the charge amplifier output at sixth cycle, where E is applied 140 MV/m with 50 mHz triangular wave AC for 6 cycles.

The electromechanical coupling coefficient kt is obtained by washing a polarized sample with hexane, cutting it to a size of 5 mm×5 mm, sampling Cp-G data in the range of 1 kHz to 110 MHz by using an impedance analyzer, and being calculated by using a free resonance analysis formula.

[Table 2]

TABLE 2

Piezoelectric properties of blended lamella crystal piezoelectric film

|   | Kind of film | PVT1 = PVT85/15 [wt %] | PVT1 = PVT81/19 [wt %] | Residual Polarization Pr [mC/m$^2$] | Coercive electric field Ec [MV/m] | Electromechanical coupling coefficient Kt |
| --- | --- | --- | --- | --- | --- | --- |
| Invention 3 | Blended lamella crystal film | 30 | 70 | 93.1 | 48.0 | 0.297 |
|   |   | 50 | 50 | 97.0 | 46.6 | 0.302 |
|   |   | 70 | 30 | 91.6 | 47.0 | 0.293 |
| Comparison item 1 | Lamella crystal film | 100 | 0 | 87.7 | 42.9 | 0.275 |
| Comparison item 4 | Lamella crystal film | 0 | 100 | 88.5 | 44.5 | 0.284 |

Note:
Comparison items 1 and 4 are produced with same producing method of Example 3.

INDUSTRIAL APPLICABILITY

According to the present invention, the piezoelectricity of the PVT having the VDF ratio of 82 to 90% represented by the PVT85/15, which is excellent in resistance to deformation, and heat resistance, etc., is improved, and therefore the piezoelectric film having piezoelectricity exceeding the PVT of less than 82 mol % of the VDF represented by the PVT75/25, which conventionally shows the highest piezoelectricity, and the method of manufacturing the piezoelectric film can be obtained. And, they contribute to the development of industries, which use and apply piezoelectric films.

What is claimed is:

1. A piezoelectric film
formed from a copolymer mixture wherein the copolymer mixture comprises at least a first copolymer (PVT1) and a second copolymer (PVT2) wherein both PVT1 and PVT2 are copolymers of vinylidene fluoride (VDF) and trifluoroethylene (TrFE),
wherein PVT1 comprises from 82 to 90 mol % of VDF and from 10 to 18 mol % of TrFE, and
wherein PVT2 comprises from 60 to 82 mol % of VDF and from 18 to 40 mol % of TrFE, and
wherein a residual polarization and an electromechanical coupling coefficient of the piezoelectric film comprising the copolymer mixture are higher than each of PVT1 and PVT2 alone.

2. The piezoelectric film according to claim 1, wherein
PVT1 comprises 85 mol % of VDF and 15 mol % of TrFE, and wherein PVT2 comprises 75 mol % of VDF and 25 mol % of TrFE.

3. The piezoelectric film according to claim 2, wherein an amount of PVT1 relative to the total weight of the film is in the range of 50 wt % to 80 wt %.

4. The piezoelectric film according to claim 1,
wherein
PVT1 comprises 85 mol % of VDF and 15 mol % of TrFe, and wherein PVT2 comprises 81 mol % of VDF and 19 mol % of TrFe.

5. The piezoelectric film according to claim 4, wherein an amount of PVT1 relative to the total weight of the film is in the range of 30 wt % to 70 wt %.

6. A producing method of a piezoelectric film
formed from a copolymer mixture wherein the copolymer mixture comprises at least a first copolymer (PVT1) and a second copolymer (PVT2) wherein both PVT1 and PVT2 are copolymers of vinylidene fluoride (VDF) and trifluoroethylene (TrFE),
wherein PVT1 comprises from 82 to 90 mol % of VDF and from 10 to 18 mol % of TrFE, and
wherein PVT2 comprises from 60 to 82 mol % of VDF and from 18 to 40 mol % of TrFE, and
a solution of a mixture of the two kinds of copolymers and a solvent is applied to a substrate and dried, and
a film of the copolymer mixture formed by drying is heat treated at a temperature range between 140° C. and a melting point.

7. The producing method of the piezoelectric film according to claim 6,
wherein PVT1 comprises 85 mol % of VDF and 15 mol % of TrFE, and wherein PVT2 comprises 75 mol % of VDF and 25 mol % of TrFE, and
wherein an amount of PVT1 relative to the total weight of the film is in the range of 50 wt % to 80 wt %.

8. The producing method of the piezoelectric film according to claim 6,
wherein PVT1 comprises 85 mol % of VDF and 15 mol % of TrFE, and wherein PVT2 comprises 81 mol % of VDF and 19 mol % of TrFE, and
wherein an amount of PVT1 relative to the total weight of the film is in the range of 30 wt % to 70 wt %.

9. A producing method of a piezoelectric film
formed from a copolymer mixture wherein the copolymer mixture comprises at wo a first copolymer (PVT1) and a second copolymer (PVT2) wherein both PVT1 and PVT2 are copolymers of vinylidene fluoride (VDF) and trifluoroethylene (TrFE),
wherein PVT1 comprises from 82 to 90 mol % of VDF and from 10 to 18 mol % of TrFE, and
wherein PVT2 comprises from 60 to 82 mol % of VDF and from 18 to 40 mol % of TrFE, and
a solution of a mixture of the two kinds of copolymers and a solvent is applied to a substrate and dried,
a film of the copolymer mixture formed by drying is stretched, and
the film is heat treated at a temperature range between 140° C. and a melting point.

* * * * *